(12) United States Patent
Han

(10) Patent No.: US 7,743,482 B2
(45) Date of Patent: Jun. 29, 2010

(54) FABRICATING METHOD OF A SEMICONDUCTOR DEVICE

(75) Inventor: Jae Won Han, Soowon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 170 days.

(21) Appl. No.: 11/863,407

(22) Filed: Sep. 28, 2007

(65) Prior Publication Data

US 2008/0142933 A1    Jun. 19, 2008

(30) Foreign Application Priority Data

Dec. 15, 2006    (KR) .................... 10-2006-0128481

(51) Int. Cl.
    *H04R 31/00*    (2006.01)
(52) U.S. Cl. .............. 29/594; 29/604; 29/606; 29/609.1; 257/531; 257/664; 257/E21.506; 257/E23.01; 336/65; 336/83; 336/176; 336/200; 336/232; 438/106

(58) Field of Classification Search ............... 29/594, 29/602.1, 604–606, 69.1; 257/531, 664, 257/E21.506, E23.01; 438/106; 336/65, 336/83, 176, 200, 232

See application file for complete search history.

(56) References Cited

U.S. PATENT DOCUMENTS 5,903,239 A * 5/1999 Takahashi et al. ..... 343/700 MS
6,645,790 B2 * 11/2003 Moghe et al. ............... 438/107

* cited by examiner

*Primary Examiner*—Paul D Kim
(74) *Attorney, Agent, or Firm*—Saliwanchik, Lloyd & Saliwanchik

(57) ABSTRACT

A semiconductor device and fabricating method thereof are provided. A first substrate with an inductor cell and a through-electrode is connected to a second substrate having an RF device circuit unit. The first substrate can be stacked on the second substrate, and a connecting electrode can electrically connect the inductor cell to the RF device circuit unit.

10 Claims, 6 Drawing Sheets

FABRICATING METHOD OF A SEMICONDUCTOR DEVICE

CROSS-REFERENCE TO RELATED APPLICATION

The present application claims the benefit under 35 U.S.C. §119 of Korean Patent Application No. 10-2006-0128481, filed Dec. 15, 2006, which is hereby incorporated by reference in its entirety.

BACKGROUND

An inductor is an element of a circuit used for sending and receiving high frequency signals. It is often shaped similar to a coil. An inductor can be implemented in a metal pattern with a spiral shape in a fabrication process of a semiconductor. Spiral-shaped inductors are often used in RF devices and analog devices. These devices are very important to the growing wireless communication market, and the characteristics thereof are represented by a Quality factor (Q).

Related art semiconductor devices that include an inductor generally have an inductor layer on an RF device circuit unit layer. The RF device circuit unit layer is formed, and the inductor layer is formed on the RF device circuit unit layer.

Since a metal film used to form the inductor layer is typically very thick, the process has many disadvantages. Also, the process is complicated by the fact that a transistor and a metal wiring are present on the substrate before the inductor layer is formed. When errors occur in the process of fabricating the inductor layer, the device formed below it on the substrate is rendered useless.

Thus, there exists a need in the art for an improved semiconductor device and fabrication process thereof.

BRIEF SUMMARY

Embodiments of the present invention provide a semiconductor device and a fabricating method thereof.

In an embodiment, a method capable of efficiently fabricating a semiconductor device can include fabricating a first substrate having an inductor cell. A second substrate having an RF device circuit unit can also be fabricated. The first substrate and the second substrate can then be stacked, and the inductor cell formed on the first substrate can be electrically connected to the RF device circuit unit formed on the second substrate using a connecting electrode. The inductor cell can represent an area where an inductor may be formed. For example, a metal pattern with a spiral shape can be formed in the inductor cell.

In an embodiment, a semiconductor device includes: a first substrate with an inductor cell and a through-electrode; a second substrate having an RF device circuit unit; and a connecting electrode electrically connecting the inductor cell to the RF device circuit unit.

A first substrate with an inductor cell and a through-electrode can be fabricated. A second substrate having an RF device circuit unit can also be fabricated. Then, the first substrate and the second substrate can be stacked, and the inductor cell can be electrically connected to the RF device circuit unit.

Also, an inductor library can be formed comprising inductors of varying shape, size, and capacity.

DETAILED DESCRIPTION

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 1:
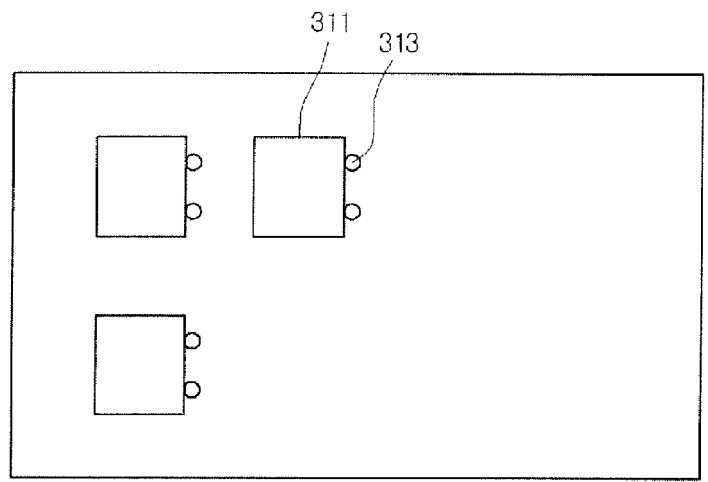
FIG. 1 is a top view of a substrate with an inductor cell according to an embodiment of the present invention.
Figure 2:
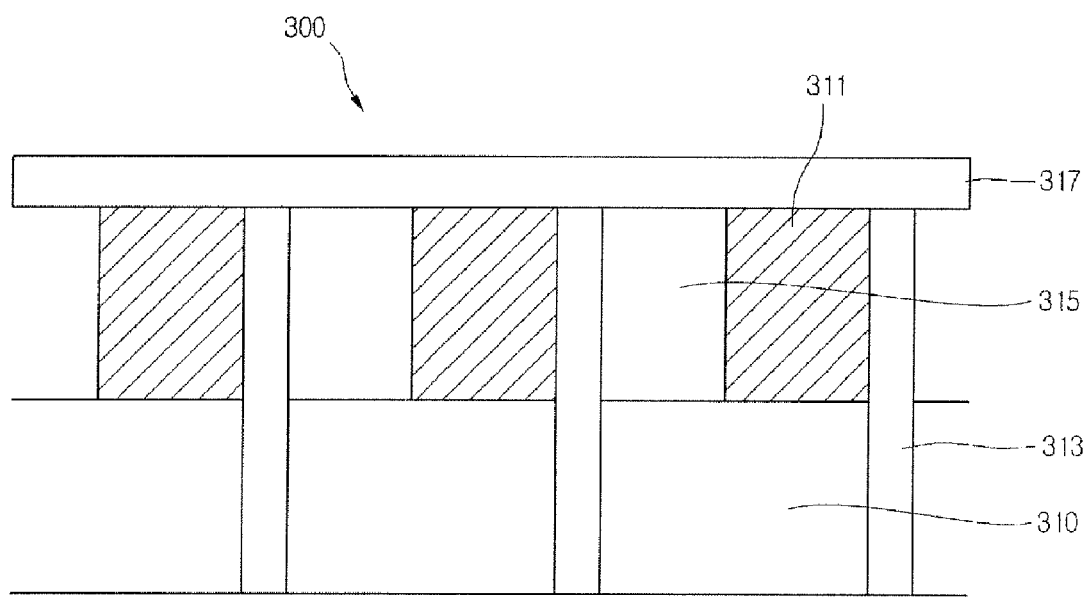
FIG. 2 is a cross-sectional view showing a substrate with an inductor cell according to an embodiment of the present invention.

FIGS. 1 and 2 show a substrate with an inductor cell that can be formed according to an embodiment of the present invention.

Referring to FIGS. 1 and 2, a first substrate 300 having an inductor cell 311 can be fabricated. A through-electrode 313 can be formed on the first substrate 300.

First, an insulating layer 315 can be formed on a first semiconductor substrate 310, and patterned in the shape for an inductor by performing a patterning and etching process. Then, an inductor barrier metal deposition and an inductor metal film filling can be performed, and a chemical mechanical polishing (CMP) process can be performed to form the inductor cell 311.

Also, a through-electrode 313 can be formed connected to the inductor cell 311 and penetrating through the first semiconductor substrate 310. The through-electrode 313 can be formed by sequentially performing a pattern process, an etch process, a metal forming process, and a CMP process on the first semiconductor substrate 310.

The inductor cell 311 and the through-electrode 313 can each be formed of any appropriate material known in the art. For example, the inductor cell 311 and the through-electrode 313 can each be formed of tungsten (W), copper (Cu), aluminum (Al), silver (Ag), gold (Au), or any combination thereof. The inductor cell 311 and the through-electrode 313 can each be deposited through any appropriate method known in the art, for example, chemical vapor deposition (CVD), physical vapor deposition (PVD), evaporation, or electrochemical plating (ECP). Also, the inductor cell 311 and the through-electrode 313 can each include a barrier metal which can be formed of any appropriate material known in the art, for example, TaN, Ta, TiN, Ti, TiSiN, or any combination thereof. A barrier metal of the inductor cell 311 can be formed by CVD, PVD, atomic layer deposition (ALD), or any other appropriate method known in the art. Additionally, a barrier metal of the through-electrode 313 can be formed CVD, PVD, ALD, or any other appropriate method known in the art.

Next, a protective layer 317 can be formed on the inductor cell 311.

Figure 3:
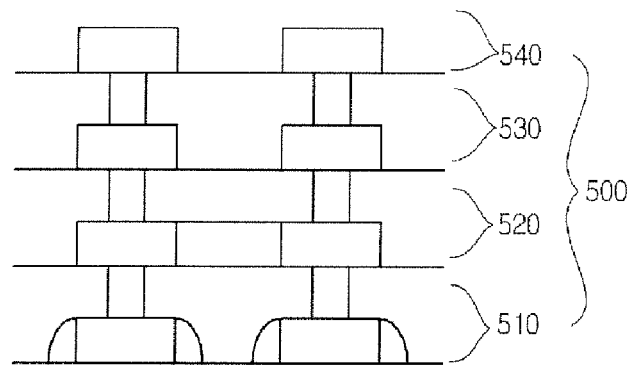
FIG. 3 is a cross-sectional view of a substrate with an RF device unit according to an embodiment of the present invention.

Referring to FIG. 3, a second substrate 500 can be fabricated including a transistor layer 510 and at least one metal layer. For example, a first metal layer 520, a second metal layer 530, and a third metal layer 540 can each be formed.

The transistor layer 510 and each metal layer (for example, 520, 530, and 540) can form the RF device circuit unit for processing signals. In an embodiment, the RF device unit circuit can include three metal layers, as shown in FIG. 3. In an alternative embodiment, the RF device unit circuit can include less than three metal layers. In a further embodiment, the RF device unit circuit can include more than three meta layers.

Figure 4:
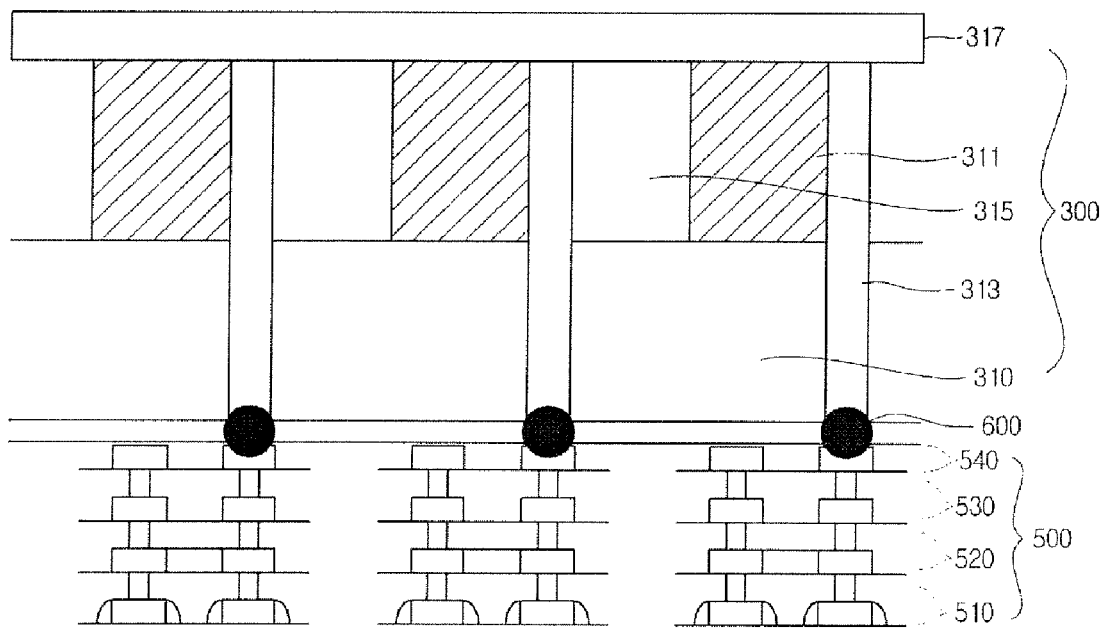
FIG. 4 is a cross-sectional view of a semiconductor device according to an embodiment of the present invention.

Referring to FIG. 4, the first substrate 300 and the second substrate 500 can be stacked.

A connecting electrode 600 can connect the inductor cell 311 on the first substrate 300 and the RF device circuit unit on the second substrate 500. The connecting electrode 600 can be electrically connected to the inductor cell 311 through the through-electrode 313 on the first substrate 300. The connecting electrode 600 can be connected to the uppermost metal layer of the RF device circuit unit. In an embodiment containing exactly three metal layers, the connecting electrode can be connected to the third metal layer 540.

Figure 5:
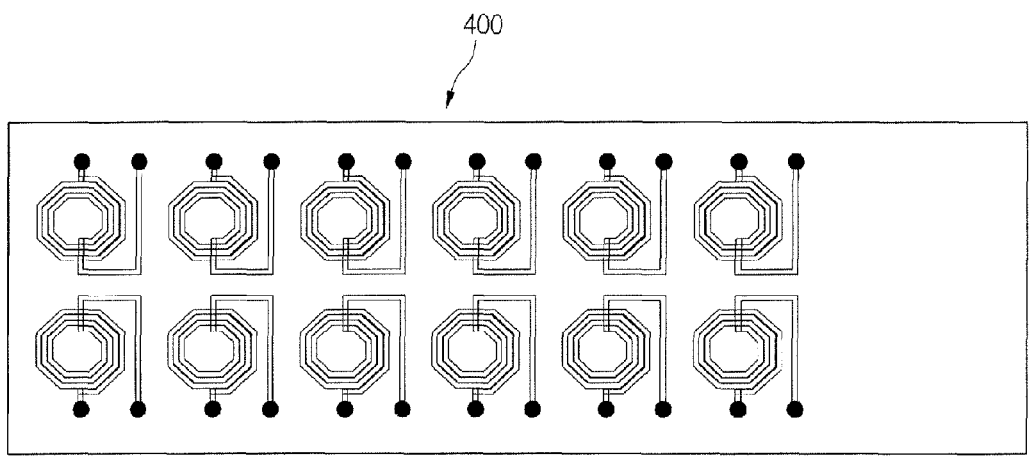
FIG. 5 is a top view showing a substrate with inductors according to an embodiment of the present invention.

FIG. 5 shows a substrate 400 with inductors of varying capacity according to an embodiment of the present invention.

Referring to FIG. 5, an inductor library can be formed by including inductors of varying capacity in one mask. While FIG. 5 shows an example of an inductor library formed in two rows and six columns on the substrate 400, the number of rows and the number of columns can each be any reasonable number.

The through-electrode can be designed to allow the electrode and the wiring to be positioned on the scribe lane. Circuit areas in which circuits may be formed and a scribe lane partitioning a boundary between the circuit areas can be defined in the semiconductor device. In an embodiment, the semiconductor substrate defining the circuit areas and the scribe lane can be prepared. Next, a circuit unit can be formed within each circuit area, and a through-electrode can be formed in the scribe lane.

In an embodiment, the through-electrode and the through-electrode and inductor wiring can each be formed of multiple metal layers, for example, two metal layers.

Each inductor can be formed in the shape of a circle, a square, a triangle, or any other appropriate shape known in the art. Also, each through-electrode can be formed in the shape of a circle, a square, a triangle, or any other appropriate shape known in the art.

FIGS. 6 to 11 show a process for fabricating a substrate with a through-electrode and an inductor according to an embodiment of the present invention.

Figure 6:
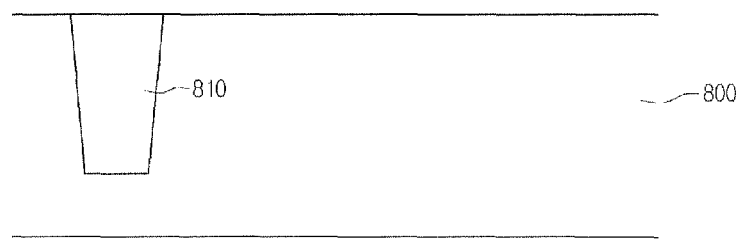
FIGS. 6 to 11 are cross-sectional views showing a fabricating method of a semiconductor device according to an embodiment of the present invention.

Referring to FIG. 6, a through-electrode 810 can be formed on a semiconductor substrate 800.

The semiconductor substrate 800 can be any appropriate material known in the art. In an embodiment, the semiconductor substrate 800 can be a silicon wafer. The substrate 800 does not need to be high quality because it is only used to form the inductor.

The through-electrode 810 can be formed at a depth of about 50 µm to about 500 µm, and the critical dimension (CD) of the through-electrode can be formed at a level of about 1 µm to about 10 µm.

The through-electrode 810 can include a barrier metal, which can be any appropriate material known in the art. For example, the material used for the barrier metal can be Ti, TiN, Ti/TiN, Ta, Ta/N, Ta/TaN, Ta/TaN, Co, Co compound, Ni, Ni compound, W, W compound, nitride, or any combination thereof.

The barrier metal can be formed by a metal thin film deposition method, for example, PVD, sputtering, evaporation, laser ablation, ALD, or CVD. The thickness of the barrier metal can be formed in the range of from about 20 Å to about 1000 Å.

In an embodiment, the metal film for forming the through-electrode 810 can be formed of W, Cu, Al, Ag, Au, or any combination thereof. The metal film can be formed by PVD, sputtering, evaporation, laser ablation, ALD, CVD, or any other appropriate method known in the art. The thickness of the metal film can be formed in the range of from about 50 µm to about 900 µm. The metal film can be formed over the semiconductor substrate 800 where the through-electrode 810 may be formed.

Next, the metal film can be removed to form the through-electrode 810. To remove the metal film, any appropriate method known in the art can be used, for example, a CMP process or an etch back process. The metal film can be removed until the semiconductor substrate 800 is exposed.

Figure 7:
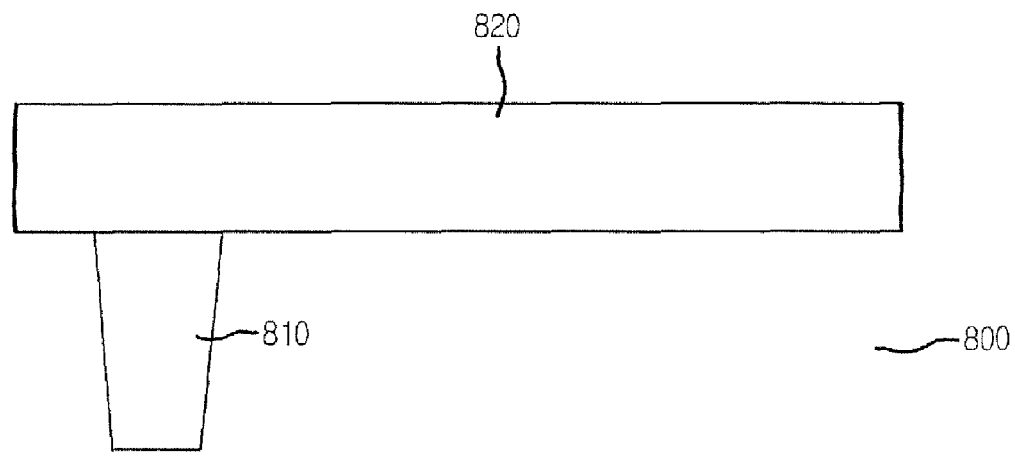

Referring to FIG. 7, a metal film 820 for forming an inductor cell can be formed on the through-electrode 810.

The metal film 820 for forming the inductor cell can be formed of any appropriate material known in the art. For example, the metal film 820 for forming the inductor cell can be formed of Al; a mixed metal of Al and Cu; a mixed metal of Al and Si; a mixed metal of Al, Si, and Cu; Ti, TiN, Ti/TiN, Al/Ti/TiN; or any combination thereof.

The metal film 820 for forming the inductor cell can be formed to a thickness of about 1 µm to about 10 µm. The metal layer 820 can be formed by CVD, PVD, or any other appropriate method known in the art.

Figure 8:
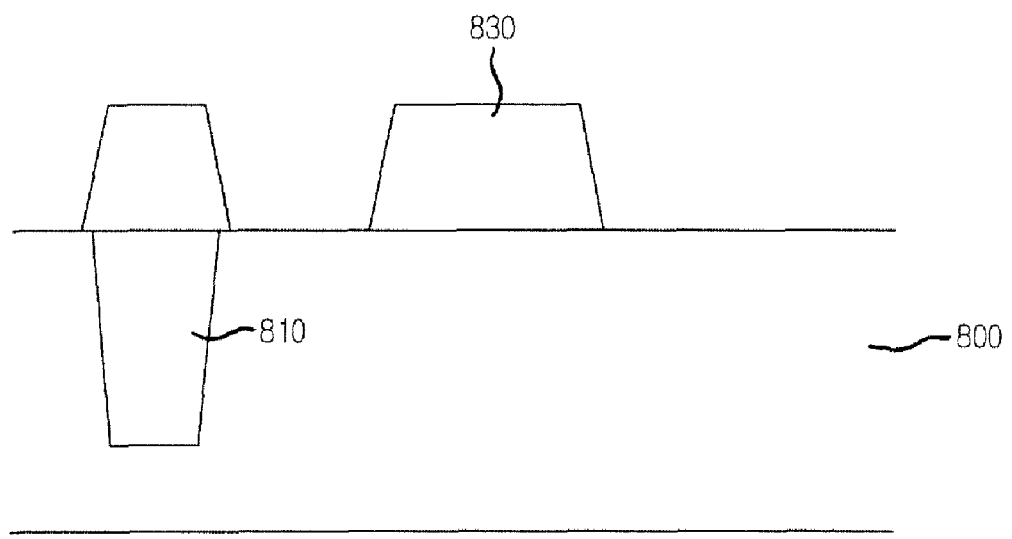

Referring to FIG. 8, a patterning can be performed on the metal film 820 to form the inductor cell 830.

Figure 9:
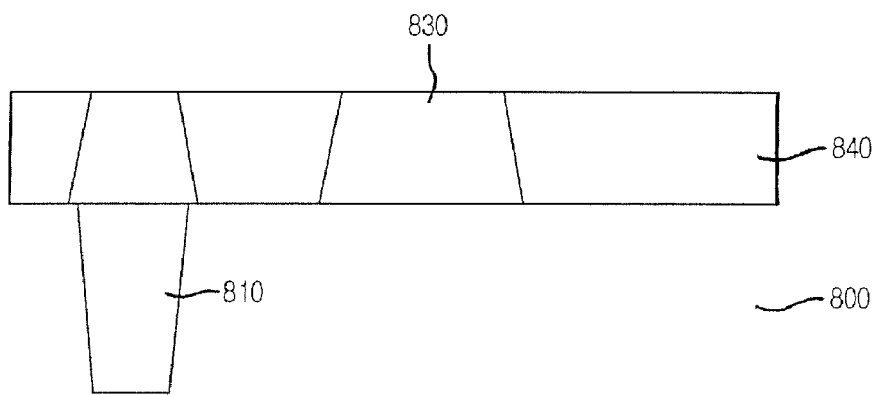

Referring to FIG. 9, an insulating layer 840 can be formed on the inductor cell 830.

The insulating layer 840 can be formed of $SiO_2$, borophosphosilicate glass (BPSG), tetra ethyl oxisilane (TEOS), SiN, or any other appropriate material known in the art. The insulating layer 840 can be formed to a thickness of about 1.5 µm to about 15 µm. Also, the insulating layer 840 can be formed by any appropriate method known in the art, for example, an electric furnace, CVD, or PVD. A polishing process, for example, CMP or back grind, can be performed on the insulating layer 840 until the inductor cell 830 is exposed.

Figure 10:
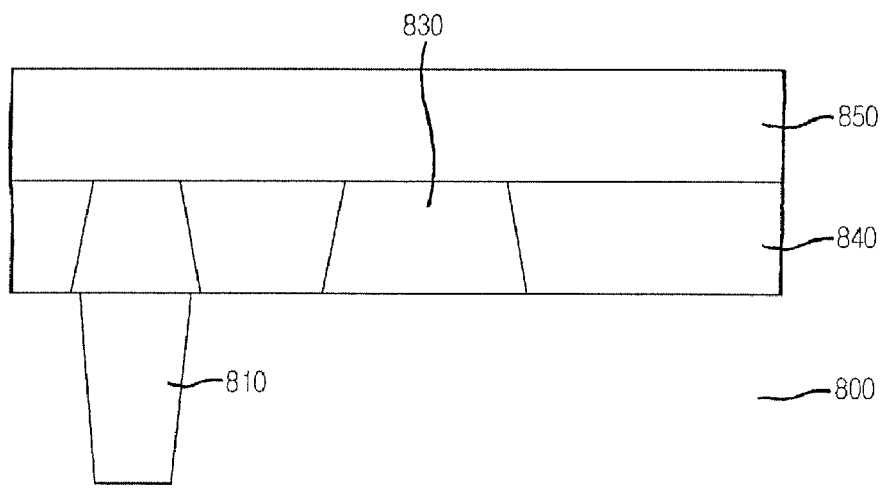

Referring to FIG. 10, a protective layer 850 can be formed on the inductor cell 830 and the insulating layer 840.

The protective layer 850 can be formed of $SiO_2$, BPSG, TEOS, SiN, or any other appropriate material known in the art. The protective layer 850 can be formed to a thickness of about 0.3 µm to about 5 µm. The protective layer 850 can be formed by an electric furnace, CVD, PVD, or any other appropriate method known in the art.

Figure 11:
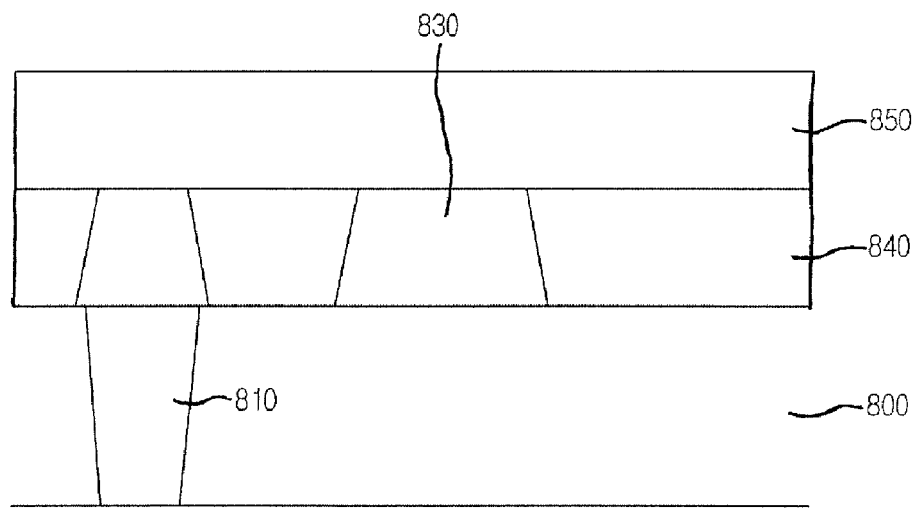

Referring to FIG. 11, a polishing process can be performed on the semiconductor substrate 800 to expose the through-electrode 810.

The polishing process can be CMP, back grind, or any other appropriate process known in the art. In an embodiment, the thickness of the semiconductor substrate 800 after the polishing can be from about 50 µm to about 500 µm.

In an embodiment, a semiconductor device with an inductor as described above can be used in a system in a package (SiP).

Since the first substrate fabricating process and the second substrate fabricating process can be performed separately, any errors that may occur in the first substrate fabricating process do not cause the second substrate to be rendered useless.

Also, crosstalk can be reduced since inductors can be spaced apart from each other. Therefore, characteristics of the RF semiconductor device can be improved.

Also, it is possible to make a library of inductors since the substrate with an inductor cell is fabricated separately.

Furthermore, an RF device circuit that is not affected by the inductor cell process can be formed since the inductor cell process is performed separately from the transistor and metal wiring fabricating process.

As described above, the efficiency of a semiconductor device fabricating process can be improved according to embodiments of the present invention.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the components of the subject combination arrangement within the scope of the disclosure, and the appended claims. In addition to variations and modifications in the component parts and/or arrangements, alternative uses will also be apparent to those skilled in the art.

What is claimed is:

1. A fabricating method of a semiconductor device, comprising:
    providing a first substrate comprising an inductor cell and a through-electrode;
    providing a second substrate comprising a radio frequency (RF) device circuit;
    stacking the first substrate on the second substrate; and
    electrically connecting the inductor cell to the RF device circuit unit;
    wherein a process for forming the first substrate comprises:
        forming the through-electrode on the first substrate;
        depositing a metal film on the first substrate;
        patterning the metal film to form the inductor cell;
        forming an insulating layer on the inductor cell;
        performing a polishing process on the insulating layer until inductor cell is exposed; and
        performing a polishing process on the first substrate until a lower surface of the through-electrode is exposed.

2. The method according to claim 1, wherein electrically connecting the inductor cell to the RF device circuit unit comprises electrically connecting the inductor cell to the RF device circuit unit through a connecting electrode.

3. The method according to claim 2, wherein the connecting electrode is electrically connected to the inductor cell through the through-electrode.

4. The method of claim 1, further comprising forming a protective layer on the insulating layer and the inductor cell.

5. The method of claim 1, wherein the through-electrode is formed to a depth of about 50 μm to about 500 μm, and wherein the through-electrode is formed with a critical dimension (CD) of about 1 μm to about 10 μm.

6. The method according to claim 1, wherein the insulating layer comprises at least one material selected from the group consisting of $SiO_2$, BPSG, TEOS, and SiN.

7. The method according to claim 1, wherein the inductor cell comprises at least one material selected from the group consisting of W, Cu, Al, Ag, and Au.

8. The method according to claim 1, wherein the through-electrode comprises at least one material selected from the group consisting of W, Cu, Al, Ag, and Au.

9. The method according to claim 1, wherein the through-electrode is formed on a scribe lane of the first substrate.

10. The method according to claim 1, wherein the through-electrode comprises a barrier metal, and wherein the barrier metal comprises at least one material selected from the group consisting of Ti, TiN, Ti/TiN, Ta, Ta/N, Ta/TaN, Ta/TaN, Co, Co compound, Ni, Ni compound, W, W compound, and nitride.

* * * * *